US005920596A

United States Patent [19]

Pan et al.

[11] Patent Number: 5,920,596

[45] Date of Patent: Jul. 6, 1999

[54] APPARATUS FOR AMPLIFYING A SIGNAL USING A DIGITAL PROCESSOR

[75] Inventors: Shaowei Pan, Lake Zurich; Shay-Ping T. Wang, Long Grove, both of Ill.; Bernard E. Sigmon, Gilbert; Stephen Chih-Hung Ma, Mesa, both of Ariz.; Kevin M. Laird, Keller, Tex.

[73] Assignee: Motorola, Inc., Schaumburg, Ill.

[21] Appl. No.: 08/935,212

[22] Filed: Sep. 22, 1997

Related U.S. Application Data

[63] Continuation of application No. 08/845,221, Apr. 21, 1997, which is a continuation-in-part of application No. 08/382,467, Jan. 31, 1995, Pat. No. 5,703,801, and application No. 08/381,368, Jan. 31, 1995, Pat. No. 5,642,305.

[51] Int. Cl.[6] .............................. H03K 7/08; H03K 7/04; G06F 7/00; H03G 3/20

[52] U.S. Cl. .......................... 375/238; 375/239; 375/353; 364/748.5; 330/136

[58] Field of Search ..................................... 375/238, 353, 375/239, 308, 316, 318, 319, 297; 330/136, 285, 297, 2, 10, 207 A, 251; 370/212; 364/748.5

[56] References Cited

U.S. PATENT DOCUMENTS

| | | | |
|---|---|---|---|
| 4,914,399 | 4/1990 | Doany | 330/10 |
| 5,247,264 | 9/1993 | Cripe | 330/251 |
| 5,374,896 | 12/1994 | Sato et al. | 330/149 |
| 5,510,753 | 4/1996 | French | 330/146 |
| 5,535,438 | 7/1996 | Sevic | 330/207 A |
| 5,568,088 | 10/1996 | Dent et al. | 330/151 |
| 5,570,063 | 10/1996 | Eisenberg | 330/149 |
| 5,589,796 | 12/1996 | Alberth, Jr. et al. | 330/133 |
| 5,633,893 | 5/1997 | Lampe et al. | 375/297 |
| 5,694,433 | 12/1997 | Dent | 375/297 |
| 5,699,383 | 12/1997 | Ichoyoshi | 375/297 |

*Primary Examiner*—Chi H. Pham
*Assistant Examiner*—Khai Tran
*Attorney, Agent, or Firm*—Dana B. LeMoine

[57] ABSTRACT

An apparatus for amplifying a signal that includes a digital processor (12) producing a first digital signal (20) and a second digital signal (22), a pulse width modulator (32) receiving the first digital signal (20) and producing a pulse width modulated signal, an amplitude restoration module (37) responsive to the pulse width modulator (32), the amplitude restoration module (37) producing an amplitude envelope signal, a frequency upconverter (16) receiving the second digital signal (22) and producing a frequency modulated signal, and a power amplifier (18) responsive to the frequency upconverter and the amplitude restoration module (37). The power amplifier receives the frequency modulated signal and the amplitude envelope signal and produces an amplified output signal.

18 Claims, 5 Drawing Sheets

APPARATUS FOR AMPLIFYING A SIGNAL USING A DIGITAL PROCESSOR

CROSS REFERENCES

This is a continuation of application Ser. No. 08/845,221 filed on Apr. 21, 1997, which is a continuation in part of patent application Ser. No. 08/382,467, docket number MNE00341N, Pan et al., filed Jan. 31, 1995, now U.S. Pat. No. 5,703,801 and patent application Ser. No. 08/381,368, filed Jan. 31, 1995, now U.S. Pat. No. 5,642,305. The above applications are incorporated by reference herein.

FIELD OF THE INVENTION

The present invention relates generally to high efficiency amplifier circuits.

BACKGROUND OF THE INVENTION

There are various apparatus available for amplifying signals. In amplifier applications that involve the amplification and transmission of modulated signals, a premium is placed on amplifier efficiency. In communication equipment, a radio frequency power amplifier consumes a large amount of the power for the equipment. For example, in cellular telephones and in base stations, the power amplifier may dissipate more than half of the supplied power. Traditionally, efficiency of the power amplifier in such applications varies from about 5% to about 25% depending upon the peak-to-average ratio of the transmitted signals. An increase in the efficiency of the power amplifier would lead to greatly improved product results, such as improved talk time in a cellular phone.

Accordingly, there is a great need for a more efficient apparatus for amplifying signals.

BRIEF DESCRIPTION OF THE DRAWINGS

The invention is pointed out with particularity in the appended claims. However, other features of the invention may become more apparent and certain aspects of the invention may be better understood by referring to the following detailed description in conjunction with the accompanying drawings in which:

DETAILED DESCRIPTION OF THE PREFERRED EMBODIMENT(S)

Generally, the present invention addresses the above identified need to provide a more efficient apparatus for amplifying signals. In accordance with a first aspect of the present invention, the apparatus includes a digital processor, a pulse width modulator, an amplitude restoration module, a frequency upconverter, and a power amplifier. The digital processor produces a first digital signal and a second digital signal. The pulse width modulator receives the first digital signal and produces a pulse width modulated signal. The amplitude restoration module is responsive to the pulse width modulator and produces an amplitude envelope signal. The frequency upconverter receives the second digital signal and produces a frequency modulated signal. The power amplifier is responsive to the frequency upconverter and the amplitude restoration module. The power amplifier produces an amplified output signal based on the frequency modulated signal and the amplitude envelope signal.

In accordance with another aspect of the invention, the power amplifier includes a first input responsive to the frequency modulated signal from the frequency upconverter and a second input responsive to the amplitude envelope signal from the amplitude restoration module.

Figure 1:
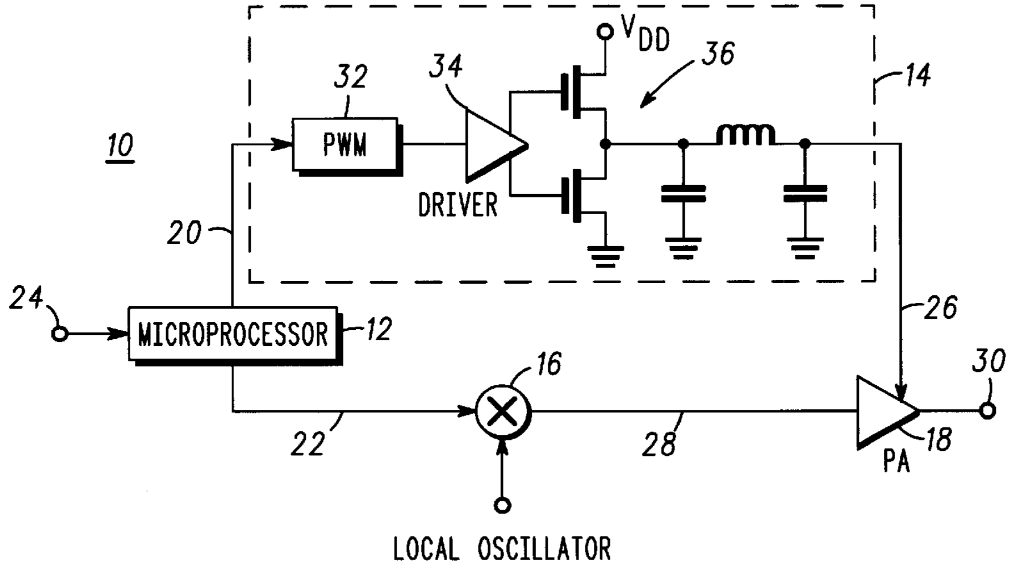
FIG. 1 is a block diagram of an embodiment of an apparatus for amplifying signals in accordance with the present invention.

Referring to FIG. 1, a block diagram of an illustrative embodiment of an apparatus 10 for amplifying signals in accordance with the present invention is illustrated. The apparatus 10 includes a digital processor 12, a modulator 14, a frequency upconverter 16, and a power amplifier 18. The modulator 14 includes a pulse width modulator 32 and an amplitude restoration module including a driver circuit 34, switching transistors 36, such as metal oxide semiconductor, bipolar, or similar electronic transistors, and accompanying analog circuitry, such as a low pass filter 38. It should be noted that in some applications, one or both of the switching transistors 36 may be replaced with other electronic devices, such as a diode.

It is to be understood that many of the specific details of any particular exemplary embodiment are disclosed herein to satisfy the best mode requirement and do not in any way limit the scope of the invention.

In the preferred embodiment, the pulse width modulator 14 is a class S modulator, such as the modulator described in F. H. Raab, et. al., "Class-S high-efficiency amplitude modulator," RF Design, vol 17, no. 5, pp. 70–75, May 1994. The upconverter 16 is preferably implemented as a multiplier driven by a local oscillator signal. The multiplier is preferably a standard frequency upconverter, such as an L-band upconverter known to those of ordinary skill in the art. The local oscillator is preferably a dual upconversion device, such as those available from many sources, such as Watkins Johnson and ST Microwave. The switching transistors 36 in certain applications are preferably implemented using high speed transistors, such as complementary Gallium Arsenide pseudomorphic high electron mobility transistors. The power amplifier 18 may be any high efficiency power amplifier such as class B, C, D, E, or F type amplifiers. Most preferably, the power amplifier 18 is a class E amplifier, During operation, a baseband signal 24, which preferably includes a first component, such as an inphase component and a second component, such as a quadrature phase component, is received at an input by the digital processor 12. The digital processor 12 produces a first digital signal 20 and a second digital signal 22. In the preferred embodiment, the first digital signal 20 is computed by taking the square root of the sum of the square of the first component and the second component of the input signal 24. The first digital signal 20 may be approximated to reduce the processing necessary in the digital processor 12.

The first digital signal 20 is applied to the pulse width modulator (PWM) 32 of the modulator device 14. The PWM 32 performs pulse width modulation of the first digital signal 20 to produce a pulse width modulated signal that is fed to the driver 34. The switching transistors 36 and low pass filter 38, in response to the driver 34, produces a signal 26 that is an amplified version of the PWM 32 output. Filtering by the low pass filter 38 causes the envelope signal 26 to be further time delayed with respect to the first digital signal 20.

The digital processor 12 also produces a second digital signal 22. The second digital signal 22 is preferably a phase and time delayed signal, which may be represented by an amplitude limited phase shifted sinusoidal function. Once again, to reduce processing demands on the digital processor 12, an estimate of the sinusoidal phase shifted function may be used. Such an estimation may be calculated by using a polynomial approximation such as a Taylor series expansion of a cosine function. The second digital signal 22 is fed to the upconverter 16 to produce an amplitude limited frequency modulated signal 28. The amplitude limited frequency modulated (FM) signal 28 is then input to a first input of the power amplifier 18. It should be noted that the phase shift in the second signal 22 is calculated to match the time delay in the envelope signal 26, so that the amplitude limited FM signal 28 is timed to reach the power amplifier 18 at substantially the same time that the corresponding amplified envelope signal 26 drives the bias input of the power amplifier 18. In this manner, the power amplifier 18 can produce an amplified signal 30 which may be applied to a load, such as to an antenna of a transmitter in a wireless communication system.

Measurements of the apparatus 10 have provided data suggesting a significant improvement in power amplification efficiency. In particular, in amplfier circuits embodying features as described herein, an amplifier efficiency between 50–65% was obtained over a current back off range of about 17 dB. The above results compare very favorably with many prior art circuits that provide efficiency greater than 50% only over a current back off range of about 3 dB. In applications requiring large peak to average signal ratios, such as satellite communication systems, very large overall power efficiency gains may be realized using amplifiers constructed in accordance with the present invention. Increased overall efficiency in a satellite leads to reduced payload weight and significantly reduced satellite costs. In addition, hand-held communication units, such as cellular phones or two-way radios, using the amplifier circuits as described herein, would have an increased talk time due to the increased amplifier efficiency. Thus, the present amplifier embodiments provide significant cost saving advantages and improved performance in many communication devices.

Figure 2:
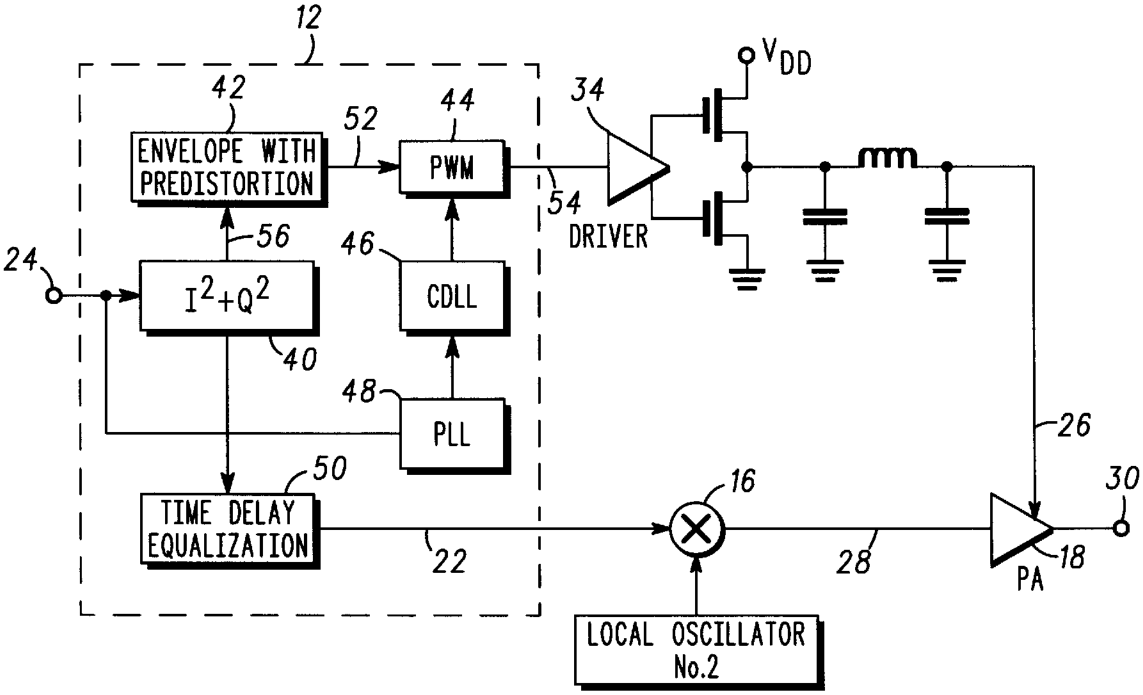
FIG. 2 is a block diagram of an apparatus for amplifying a signal that illustrates an embodiment of the digital processor of FIG. 1.

Referring to FIG. 2, a more detailed block diagram of an embodiment of the digital processor 12 is illustrated. In this embodiment, the digital processor 12 includes a sum of squares module 40, an envelope extraction with predistortion module 42, a time delay and equalization module 50, a pulse width modulator 44, a clocked delay lock loop (CDLL) 46, and a phase lock loop (PLL) 48. The envelope extraction module 42 is coupled to the sum of squares module 40, and the CDLL 46, also referred to as a delay lock loop (DLL), is coupled to the PLL 48. The pulse width modulator 44 is coupled to both the envelope extraction module 42 and the delay lock loop 46. The time delay equalization module 50 is coupled to the sum of squares module 40.

During operation, the baseband signal 24, which is preferably a sequence of digital inphase and quadrature phase data, is received by the sum of squares module 40 and the phase lock loop 48. The sum of squares module 40 processes the baseband data 24 and produces a sum of squares output signal 56, preferably $I^2+Q^2$, which is fed to the envelope extraction module 42. The envelope extraction module 42 produces an envelope extracted signal 52, such as a polynomial function of the form $ax^{1/2}+bx^{3/2}+cx^{5/2}$, where a, b, c are coefficient values, such as 1.05, −0.03, 0.001, and where x is $I^2+Q^2$. The envelope extracted signal 52 is fed to the pulse width modulator 44. The pulse width modulator 44 also receives a clocking signal from the CDLL 46 which is driven by the phase lock loop 48. The pulse width modulator 44 thereby produces a pulse width modulated envelope signal 54 which is input to driver 34. Driver 34, in combination with the switching transistors 36 and low pass filter 38 driven thereby, produces an amplitude modulated envelope signal 26.

The time delay equalization module 50 receives the sum of squares signal 56 and produces a time delayed phase shifted sinusoidal signal 22. In the preferred embodiment, the phase shifted sinusoidal signal is produced by an estimated cosine function. The amount of the time delay for the signal 22 is calculated to match the time delay incurred by the signal 26 after being delayed by the upper arm circuits 36, 38. The time delayed signal 22 is then frequency upconverted by the dual conversion mixer 16 to produce the amplitude limited frequency modulated signal 28. The power amplifier 18 produces an amplified output signal 30 which is preferably a radio frequency signal in response to the time delayed signal 22 and the power envelope signal 26.

Figure 3:
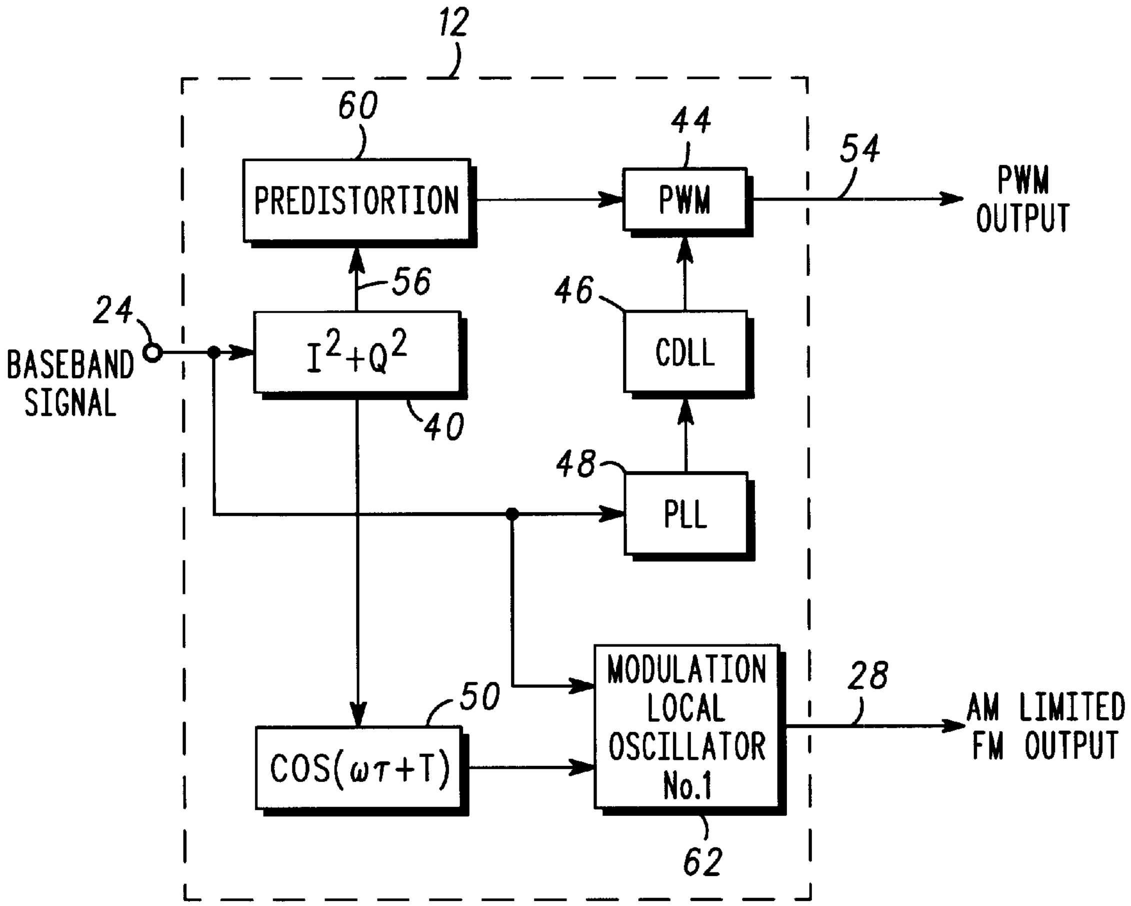
FIG. 3 is a block diagram of another embodiment of the digital processor of FIG. 1.

Referring to FIG. 3, another embodiment of the digital processor 12 is disclosed. In this embodiment, the digital processor 12 includes a predistortion generation module 60 and a digital modulator 62. The predistortion module 60 is implemented by approximating the amount of predistortion necessary for addition to the signal 56 to cancel distortion, such as induced adjacent channel interference that may be caused by phase changes, that is created by amplification within the power amplifier 18 when operating near or at saturation. In the preferred embodiment, the predistortion approximation is implemented using a polynomial function of the form $ax^{1/2}+bx^{3/2}+cx^{5/2}$, where a, b, c are coefficient values, such as 1.05, −0.03, 0.0038, and where x is $I^2+Q^2$.

In a particular illustrative embodiment where the baseband signal has a symbol rate of 25 Khz, a 64 to 1 PLL 48 synchronizes the signal to 3.2 MHz which is carried by 6 bits. A 128 to 1 clock delay lock loop 46 sets the delay for 1/128 resolution, 7 bits, for each clock. The clock's duty cycle and rise and fall edges provide an additional two bits of resolution. The combined pulse width modulator formed from the PLL 48 and the DLL 46 has a 15 bit resolution.

Figure 4:
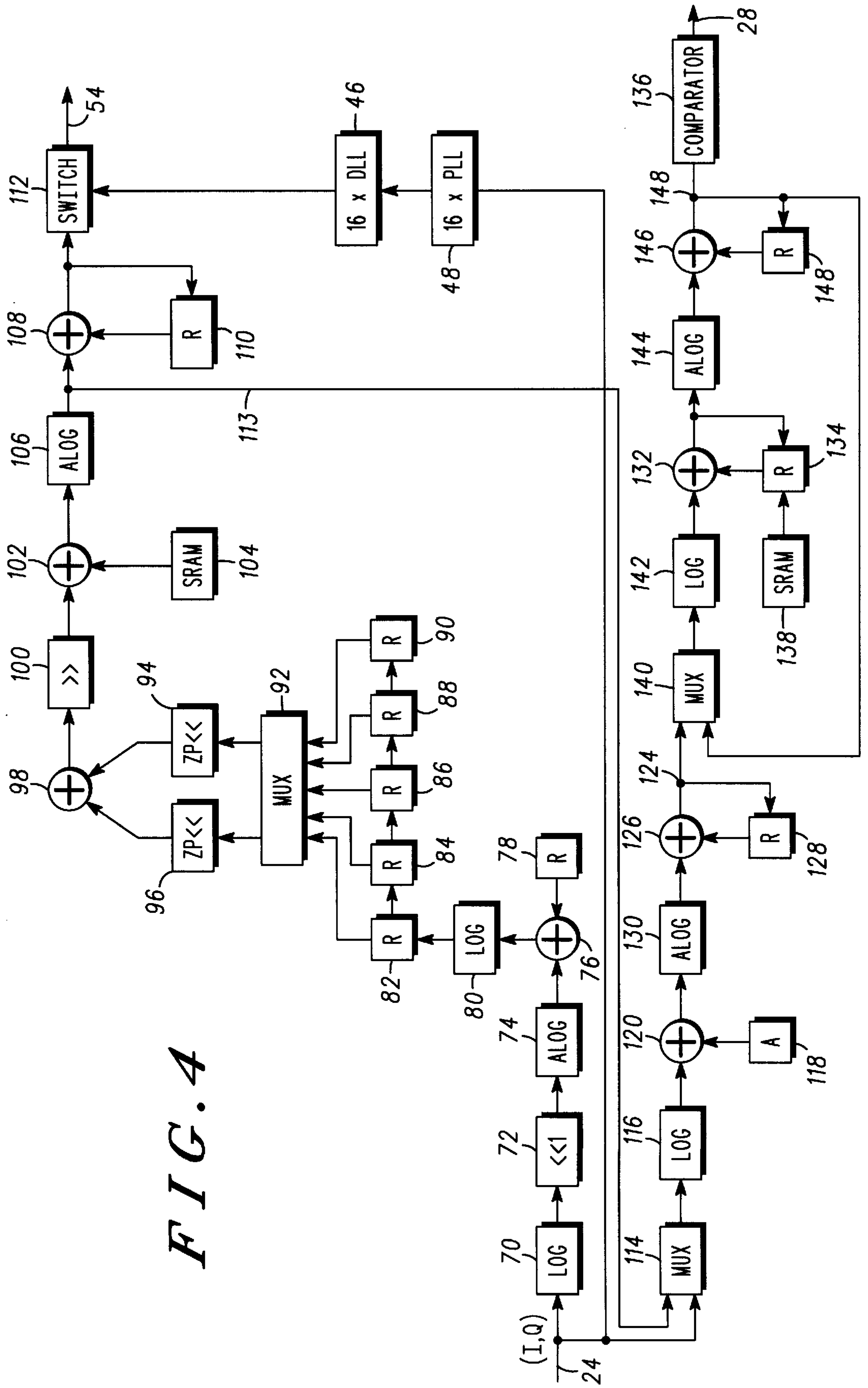
FIG. 4 is a schematic block diagram of the digital processor of FIG. 3.

Referring to FIG. 4, a more detailed schematic block diagram of a particular implementation of the digital processor 12 is disclosed. In this embodiment, the digital processor 12 is a parallel operation distributed logarithm based processor. The processor 12 includes a sum of squares module, such as sum of squares module 40 implemented as a first logarithm system including a first logarithm converter 70, a bit shifting device 72, an anti-logarithm converter 74, a summer 76, and a register 78. The processor 12 further includes an envelope extraction and predistortion module 60 implemented with a second logarithm processing system including a second logarithm converter 80, a plurality of registers 82–90, a multiplexer 92, a first zero pass (ZP) shifter 94 and a second ZP shifter 96, a summer 98, a shifter device 100, a second summer 102, a memory 104, such as a SRAM, a ROM, or a DRAM, an anti-logarithm converter 106, and an accumulating summer 108 and register 110.

The digital processor 12 further includes a logarithm based module for performing a delay matching function that includes multiplexer 114, a third logarithm converter 116, a time delay unit 118, a summer 120, a second summer 126, an inverse logarithm converter, also referred to as an anti-logarithm converter 130, an accumulating summer 126 and register 128. The processor 12 further includes a logarithm based module for performing a cosine approximation function including a multiplexer 140, logarithm converter 142, summer 132, register 134, memory 138, inverse logarithm converter 144, and accumulator including summer 146 and register 148. A comparator 136 is coupled to the output of the cosine approximation logarithm based module, which is responsive to the delay matching logarithm based module.

Finally, the digital processor 12 includes a digital pulse width modulator preferably consisting of a 16× phase lock loop 48, a 16× delay lock loop 46, and a digital switch 112.

Figure 5:
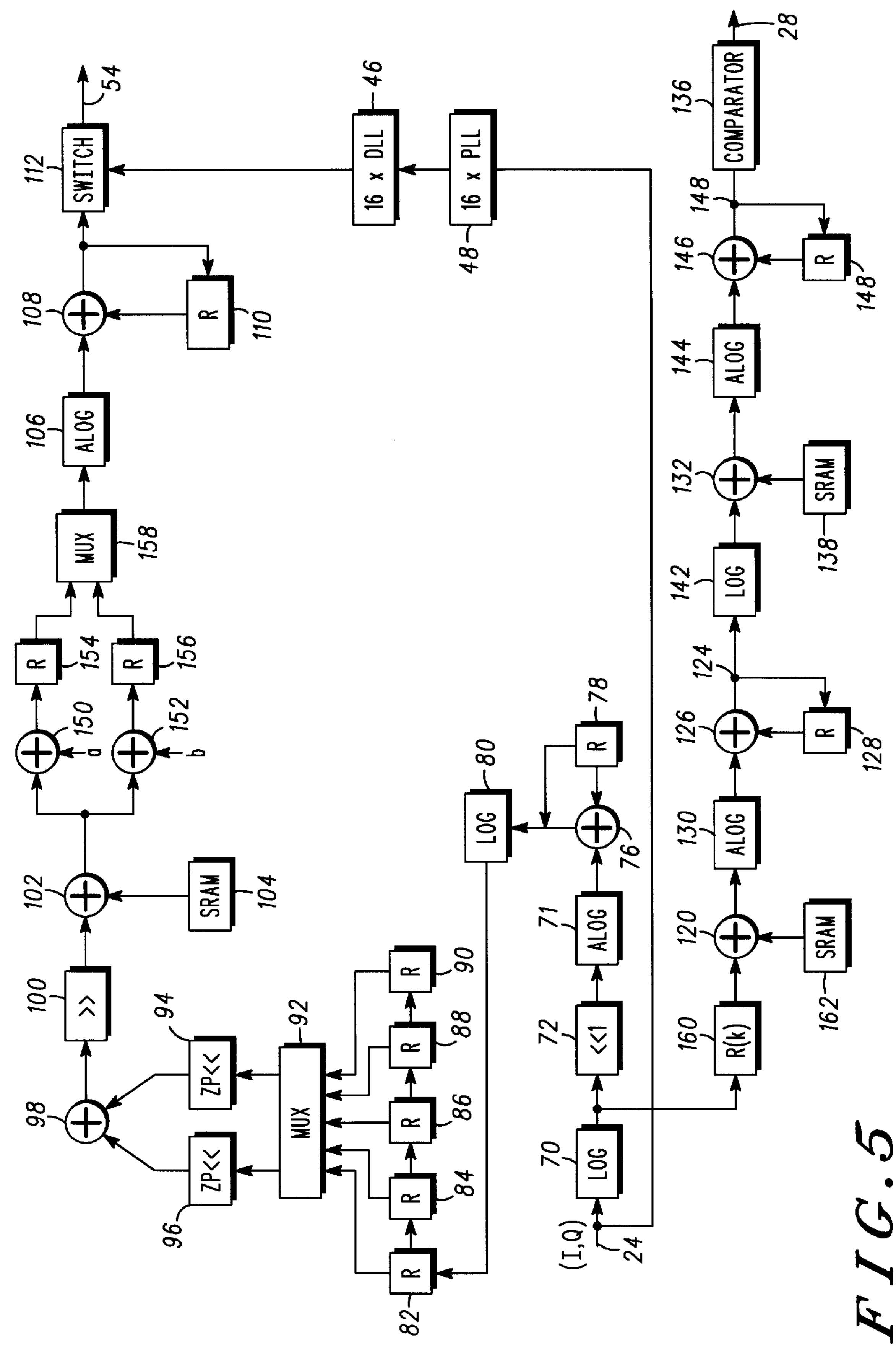
FIG. 5 is a schematic block diagram of another embodiment of the digital processor of FIG. 3.

In a presently preferred embodiment, the digital processor 12, such as the digital processor described herein in reference to FIG. 4 and FIG. 5, may be implemented as an integrated circuit, such as a high speed low power integrated circuit using complementary metal oxide semiconductor, gallium arsenide technology, or other available semiconductor technology.

The logarithm converters 70, 80, 116, 142 and the anti-logarithm converters 74, 106, 130, 144 are preferably implemented as described in prior patent application Ser. No. 08/382,467, filed Jan. 31, 1995, docket number MNE00341N, by Pan et al., the entire contents of which is incorporated herein by this reference. However, other logarithm converters and inverse logarithm converters with suitable accuracy and response times may also be used. For example, any of the logarithm converters or inverse logarithm converters described in the U.S. Pat. No. 5,553,012 or describedf in any of the following co-pending patent applications may be used: patent application Ser. Nos. 08/381,167, 08/381,368, 08/391,880, 08/508,365.

All of the above identified co-pending patent applications are incorporated by reference herein.

In addition, although several discrete logarithm/inverse logarithm converters have been disclosed, it is further contemplated that a shared logarithm or inverse logarithm converter could be used to perform more than one of the logarithm converter functions. For example, a single logarithm/inverse logarithm pair may be a shared resource with a time multiplexed input and a time de-multiplexed output. In this manner, the number of logarithm and inverse logarithm converters may be beneficially reduced leading to further reduced hardware costs.

During operation, a baseband signal 24, such as a digital baseband signal containing inphase and quadrature components, I, Q, is input to logarithm converter 70 and processed by the one bit shifter 72, antilog converter 74, accumulator 76, and register 78 to produce an amplitude signal 56, $I^2+Q^2$. The squaring operation is performed in the logarithm domain by the bit shifter 72, since a binary shift is the same as multiplying by 2 and since multiplying by 2 in the logarithm domain is equivalent to an exponentiation by a power of 2. A second logarithm domain function is performed by the predistortion module 60 which includes log converter 80, registers 82–90, multiplexer 92, zero pass shifters 94, 96, summers 98 and 102, right shifter 100, memory 104, and inverse logarithm converter 106 with output accumulator 108, 110.

The output 52 is then fed into the pulse width modulator which is preferably implemented as switch 112 driven by delay lock loop 46 and phase lock loop 48. The switch 112 produces a pulse width modulated signal 54.

In the lower portion of the digital processor 12, the baseband input signal 24 and an amplitude signal 113 from the predistortion module 60 are received by the multiplexor 114 and passed to the delay matching logarithm based functional unit. This logarithm based function unit includes the logarithm converter 116, summer 120, register 118, inverse log converter 130, accumulator 126 with register 128. The delay matching logarithm based functional unit approximates a sinusoidal function, such as a cosine function with a phase shift that is calculated to correspond to a time delay, T. In the preferred embodiment, the time delay T corresponds to an amount of time required so that the amplitude modulated signal 26 and phase signal 28 properly recombine in time synchronization at the power amplifier 18. The output 124 from the delay matching logarithm based module is received by the cosine approximation logarithm based processing unit including multiplexer 140, logarithm converter 142, summer 132, register 134, memory 138, inverse logarithm converter 144, and accumulator 146 with register 148. This logarithm based module approximates taking a cosine function of the signal 124 to produce cosine signal 148 which is fed to comparator 136. The comparator 136 amplitude limits cosine signal 148 and produces the amplitude limited frequency modulated signal 28.

Referring to FIG. 5, an alternative embodiment for the digital processor 12 is illustrated. Although the design of FIG. 5 is similar to that of FIG. 4, the delay compensation function is performed in the upper arm of the circuit of FIG. 5 instead of the lower arm as in FIG. 4.

The upper-arm is for envelope restoration and the lower-arm is for envelope elimination. The operation of the digital processor 12 in this embodiment is illustrated as follows:

Upper-Arm operations:

Logarithm unit 70 takes the logarithm of input signal 24. The input signal 24 is squared by a left shift operation at 72 and an anti-log function is performed to recover $I^2$ and $Q^2$ which are accumulated at 78. The log of the accumulated result is taken at log converter 80. Differential delays are determined from a delay of 0 to 4 via shift registers 82–90. The output from the shift registers 82–90 is fed to MUX 92 and output to two zero pass shift registers 94 and 96 to determine a different exponent operation of 0, 1, 3, and 5 in the adder 98. Further detail of this opertion is shown in Table III as follows:

TABLE III

The Operation of the {ZP<<} (2)

| Operation: | {ZP<<} (1) | {ZP<<} (2) |
|---|---|---|
| $i^1$ | P | Z |
| $i^3$ | P | <<1 |
| $i^5$ | P | <<2 |

Next, a shift right is performed by shifter 100 for a square root operation and selected coefficients from memory 104 are added to each term of the polynomial to perform a pre-distortion operation. The coefficients a and b are then added to the output terms at summers 150 and 152 to handle delay compensation of the amplitude signal and the result is stored in registers 154 and 156. An anti-log operation is performed by inverse log converter 106 and accumulated in register 110 by summer 108 to produce a pre-distorted and delay compensated signal. This resulting signal is sent to the switch 112 to generate a pulse width modulation signal using the switch 112 together with the DLL 46 and PLL 48.

Lower-Arm Operations:

The input signal 24 is converted to the logarithm domain by logarithm converter 70 and delay matched by the registers 160 to compensate for a delay amount that is equal to "top" of the upper-arm delay plus the filter delay. An arctangent operation is performed by adder 120 using coefficients from SRAM 162 that correspond to a Taylor series expansion of the arctan function to determine a phase angle of the input signal 24. The result from the adder 120 is then inverse log converted at inverse log converter 130 and accumulated at summer 126 and register 128 to compute a phase change in the input signal 24. A logarithm conversion at 142 is performed on the phase signal and coefficients from memory 138 corresponding to a Taylor series approximation of a cosine function are applied at adder 132. The result of the cosine approximation is produced after applying the inverse log conversion at 144. The results are accumulated at 146 and 148 for the cosine of the phase signal. It should be noted that the comparator 136 is not needed if the amplitude of the cosine signal is limited.

Figure 6:
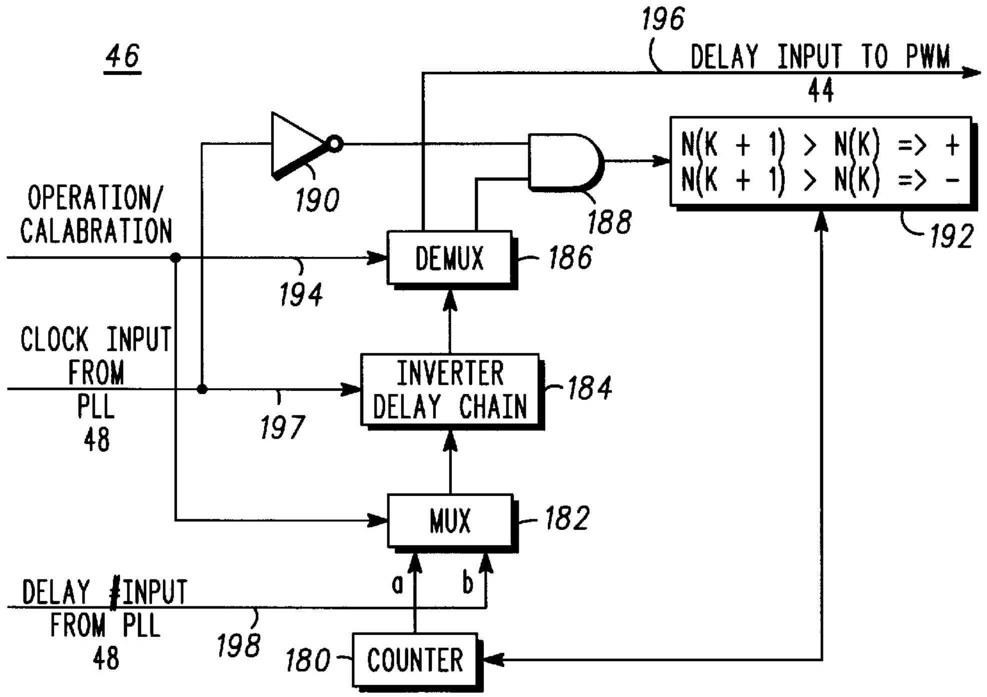
FIG. 6 is a block diagram of an embodiment of a delay lock loop found within the digital processor of FIG. 3.

Referring to FIG. 6, a block diagram of a delay lock loop (DLL) 46 is illustrated. DLL 46 includes a selectable delay unit 184, a multiplexor 182, a counter 180, a demultiplexor 186, an inverter 190, comparator 188, and decision logic 192. The DLL 46 is used to support the pulse width modulator function within the digital processor 12. The DLL 46 has a clock input 197, a numerical delay input 198, and a operation/calibration setting input 194. The DLL 46 produces a delayed digital output 196 that is fed to PWM 44.

Figure 7:
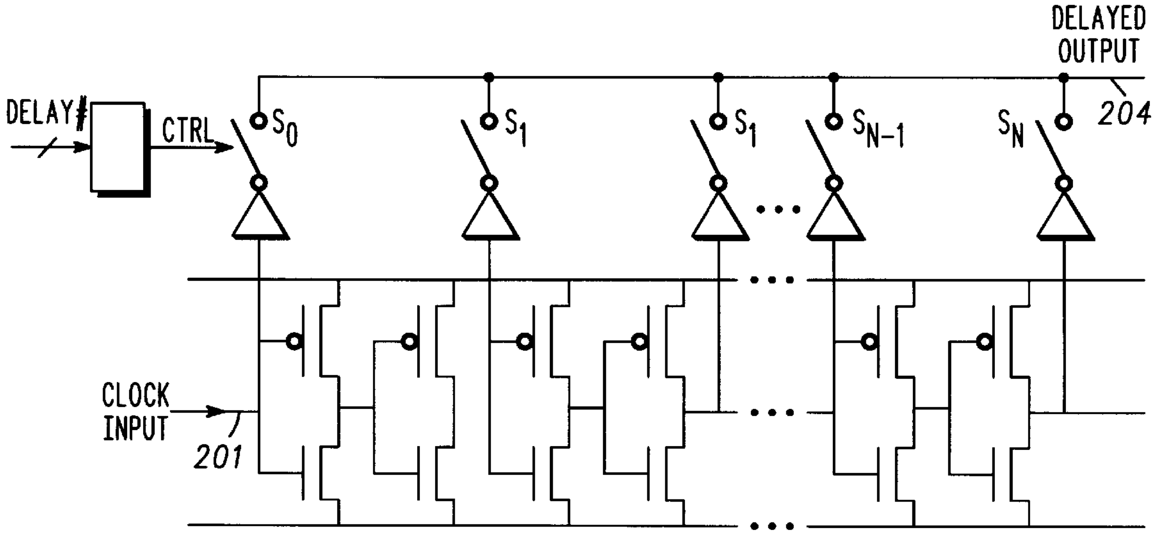
FIG. 7 is a schematic diagram of a delay chain within the delay lock loop of FIG. 6.

The delay unit 184 may be implemented as a plurality of inverters, as shown in more detail in FIG. 7. The delay unit 184 has two inputs, the clock input 197, and a numerical input selected by the multiplexor 182 originating from either the delay input 198 or the counter 180. The numerical input indicates a number of inverters used in the delay chain to provide a desired time delay. In the preferred embodiment, the counter 180 is a numerical asynchronous counter which may be 8 bits or more. The output of the delay unit 184 is then passed to DMUX 186 and then fed to either the output 196 or to comparator 188. The output of comparator 188 is fed to decision logic 192. The decision logic 192 is used to either increment or decrement the counter 180 in a feedback loop.

In FIG. 7, the input clock 202 is delayed by a series of inverter pairs. If the switch S1 is closed, the delayed output 204 is one inverter pair delayed from the input clock 202. If the switch S N−1 is closed, the delayed output 204 is N−1 inverter pairs delayed from the input clock 202.

In order to know the number of inverter pairs within a particular clock signal, a calibration circuit is designed into the DLL 46. When the operation/calibration input is set to the calibration mode, MUX 182 is switched to the a input, DMUX 186 is switched to the b input, and the counter 180 is initialized to 0. The inverse of the clock input and the delayed clock input from delay unit 184 are sent to the comparator 188. The output of the comparator 184 is then monitored by decision logic 192. If the previous output of the comparator 188 is higher than the current output, the counter will add one, otherwise, the counter will subtract one, as determined by logic unit 192. If the decision logic 192 produces alternating add and subtraction operations, then the calibration is finished. The output of the counter 180 at this time is the number of the inverter pairs inserted within a clock signal path. After calibration, any portion or fraction of the clock can be provided by the DLL 46, within the resolution of the circuit. For example, if a clock has 100 inverter pairs, a pulse signal have a width of 10% of a full clock can be provided by selecting a signal with 10 inverter pair delay at the DLL 46.

It will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. An apparatus for amplifying a signal, the apparatus comprising:

a digital processor including a digital logarithm converter, a shifter, and a digital inverse logarithm converter wherein the digital logarithm converter, the shifter, and the digital inverse logarithm converter effect an exponentiation operation, the digital processor producing a first digital signal and a second digital signal;

a pulse width modulator receiving the first digital signal and producing a pulse width modulated signal;

an amplitude restoration module responsive to the pulse width modulator, the amplitude restoration module producing an amplitude envelope signal;

a frequency upconverter receiving the second digital signal and producing a frequency modulated signal; and a power amplifier responsive to the frequency upconverter and the amplitude restoration module, the power amplifier receiving the frequency modulated signal and the amplitude envelope signal and producing an amplified output signal.

2. The apparatus of claim 1, wherein the digital processor receives a baseband digital input signal having a first component and a second component and wherein the first digital signal is derived from a square of the first component and a square of the second component.

3. The apparatus of claim 2, wherein the first component is an inphase component and the second phase is a quadrature phase component.

4. The apparatus of claim 1, wherein the second signal is a time delayed signal.

5. The apparatus of claim 1, wherein the frequency modulated signal is amplitude limited.

6. The apparatus of claim 1, wherein the power amplifier comprises a class E type power amplifier.

7. The apparatus of claim 1, wherein the pulse width modulator comprises a digital pulse width modulator that is integrated into the digital processor.

8. The apparatus of claim 1, wherein the digital processor comprises a polynomial processor.

9. The apparatus of claim 1, wherein the digital processor includes a pre-distortion module.

10. The apparatus of claim 1, wherein the digital processor includes at least one of a phase lock loop and a delay lock loop.

11. The apparatus of claim 1, wherein the digital processor includes a modulator and wherein the second digital signal is an amplitude limited frequency modulated signal.

12. The apparatus of claim 1, wherein the digital processor approximates a sinusoidal function using a polynomial to produce the second digital signal.

13. The apparatus of claim 1, wherein the digital processor comprises a parallel processing device including a logarithm converter, combinatorial logic, and an inverse logarithm converter.

14. The apparatus of claim 1, wherein the digital processor comprises a summation of squares generator, a predistortion module responsive to the summation of squares generator, a cosine approximation unit responsive to the summation of squares generator, a phase lock loop, a delay lock look responsive to the phase lock loop, and a pulse width modulator responsive to the predistortion module and the delay lock loop.

15. An apparatus for amplifying a signal, the apparatus comprising:

a digital processor including a digital logarithm converter, a shifter, and a digital inverse logarithm converter wherein the digital logarithm converter, the shifter, and the digital inverse logarithm converter effect an exponentiation operation, the digital processor having a first digital output and a second digital output;

an amplitude restoration module responsive to the first output of the digital processor, the amplitude restoration module having an amplitude signal output;

a frequency upconverter responsive to the second digital output of the digital processor and having a frequency modulated output; and a power amplifier having a first input responsive to the frequency modulated output of the frequency upconverter and a second input responsive to the amplitude signal output of the amplitude restoration module, the power amplifier further comprising an amplifier output.

16. The apparatus of claim 15, wherein the digital processor includes a logarithm converter, a bit shifter responsive to the logarithm converter, and an inverse logarithm converter responsive to the shifter.

17. The apparatus of claim 15, wherein the digital processor includes a predistortion estimation module and a pulse width modulator.

18. The apparatus of claim 15, wherein the digital processor includes a plurality of logarithm converters and a phase lock loop.

* * * * *